United States Patent [19]
Nagase

[11] Patent Number: 5,998,095
[45] Date of Patent: Dec. 7, 1999

[54] NEGATIVE-WORKING PHOTOSENSITIVE MATERIAL

[75] Inventor: Hiroyuki Nagase, Shizuoka, Japan

[73] Assignee: Fuji Photo Film Co., Ltd., Ashigara, Japan

[21] Appl. No.: 09/131,701

[22] Filed: Aug. 10, 1998

[30] Foreign Application Priority Data

Aug. 12, 1997 [JP] Japan .................................... 9-217625

[51] Int. Cl.$^6$ ....................................................... G03F 7/11
[52] U.S. Cl. .......................................................... 430/273.1
[58] Field of Search ........................................... 430/273.1

[56] References Cited

U.S. PATENT DOCUMENTS 5,597,677  1/1997  Kangas ................................. 430/273.1

FOREIGN PATENT DOCUMENTS 0 356 954 A2  7/1990  European Pat. Off. .
10-104842A  4/1998  Japan .

*Primary Examiner*—Cynthia Hamilton
*Attorney, Agent, or Firm*—Burns, Doane, Swecker & Mathis, LLP

[57] ABSTRACT

A negative-working photosensitive material having formed on a support a photopolymerizable layer containing an addition polymerizable compound having at least one ethylenically unsaturated double bond, a photopolymerization initiator, and a high molecular weight binder and also having formed on the layer a protective layer containing a water-soluble vinyl polymer and a polymer which does not have a compatibility with polyvinyl alcohol and is water soluble in itself.

The protective layer has a practically sufficient adhesive property to the photopolymerizable layer and the photosensitive layer has a high sensitivity to an $Ar^+$ laser and a TAG-SHG laser and is suitably used as a photosensitive lithographic printing plate.

3 Claims, No Drawings

NEGATIVE-WORKING PHOTOSENSITIVE MATERIAL

FIELD OF THE INVENTION

The present invention relates to a negative-working photosensitive material. In particular, the present invention relates to a negative-working photosensitive material having a very high sensitivity to the light in a visible light region, showing also a good adaptability for, for example, an Ar laser light source and a YAG-SHG laser light source, and being used in wide fields such as printing plates, printed circuits, coating materials, inks, hologram recording, three-dimensional shaping, etc.

BACKGROUND OF THE INVENTION

Hitherto, many image-forming methods utilizing photopolymerization systems are known. For example, the following methods are known: a method of forming a negative-working photosensitive material comprising an addition polymerizable compound containing an ethylenical double bond, a photopolymerization initiator, and, if desired, an organic high molecular weight binder, a thermal polymerization inhibitor, etc., on a support as a coating layer, image-exposing the desired image portions of the coating layer to a desired image to harden by polymerization the exposed portions, and dissolving off the unexposed portions to form a hardened relief image; a method of forming a layer of the above-described negative-working photosensitive material between two supports at least one of which is transparent and, after image-exposing from the transparent support side to induce the change of the adhesive strength by light, releasing the support to form an image; a method of forming a photosensitive material having formed a microcapsule layer having a photopolymerizing composition and a coloring material such as a leuco dye, etc., as the content, image-exposing the photosensitive material to photo-harden the microcapsules at the exposed portions, and rupturing the microcapsules at the unexposed portions by a press-treatment or a heat treatment to color by contacting the content and a coloring material developer, whereby colored images are formed; an image-forming method of utilizing the change of a toner attaching property of a photopolymerizing composition by light; an image-forming method of utilizing the change of the refractive index of a photopolymerizing composition with light, etc.

Recently, with the development of an image-forming technique, a photopolymer having a high sensitivity to a light of a visible region as a photosensitive material suitable for, for example, non-contact type projection light-exposure plate making, visible laser plate making, etc., has been demanded. As a light of a visible laser used in this case, the 488 nm light of an $Ar^+$ laser, the 532 light of a YAG-SHG laser, etc., have been considered to be useful.

In such a photopolymer polymerizing system, a high sensitization is an important factor and many photosensitive systems utilizing a radical polymerization profitable for the high sensitization have been investigated and developed. However, a radical polymerization system tends to receive a polymerization hindrance with oxygen, an attempt of forming a protective layer excellent in the oxygen interceptive property on the polymerization layer has been made. This is described in detail in U.S. Pat. No. 3.458,311 and JP-A-55-49729 (the "term" as used herein means an "unexamined published Japanese patent application"). Also, water-soluble polymers such as polyvinyl alcohol, polyvinyl pyrrolidone, acidic celluloses, etc., are known as such a material excellent in the oxygen interceptive property.

However, when a hydrophilic layer comprising such a water-soluble polymer is laminated on an oleophilic polymerization layer, layer separation tends to occur due to lack of an adhesive force, and the separated portions cause the faults such as a poor hardening of the layer by the polymerization hindrance with oxygen. Thus, it becomes important to sufficiently improve the adhesive force between these two layers, and various attempts for improving the adhesive property are proposed. For example, JP-A-47-469 and JP-A-49-70702 describe that a sufficient adhesive property is obtained by mixing 20 to 60% by weight of an acrylic emulsion or a water-insoluble vinyl pyrrolidone-vinyl acetate copolymer with a hydrophilic polymer mainly comprising polyvinyl alcohol and laminating the mixture on the polymerization layer. However, the method may be effective for the adhesive property with a protective layer, but because the addition amount of the mixture to polyvinyl alcohol is relatively large, the oxygen intercepting power is decreased and the sensitivity is insufficient, or there is a problem that when after light-exposure, the photopolymer layer is subjected to a development treatment with an aqueous alkali solution, the water-soluble polymer is insufficiently released in a suitable development condition, which results in easily causing a poor inking property.

SUMMARY OF THE INVENTION

Accordingly, an object of the present invention is to provide a negative-working photosensitive material which does not have the problems as described above and has a high sensitivity adaptable to an $Ar^+$ laser or a YAG-SHG laser, wherein a protective layer thereof and a photopolymerizable layer thereof have a practically sufficient adhesive property without deterioration of other performances.

As a result of various investigations to achieve the above-described object, it has been found that by adding a specific polymer to a hydrophilic polymer mainly comprising polyvinyl alcohol, the adhesive property between the protective layer and the photopolymerizable layer can be improved to a sufficient strength for practical use without deterioration of the sensitivity, the inking property, a development processing property, and the image resolving power. The present invention has been completed based on this finding.

That is, the above-described object can be achieved by the present invention described hereinbelow.

According to the present invention there is provided a negative-working photosensitive material comprising a support, and having formed thereon (a) a photopolymerizable layer comprising an addition polymerizable compound having at least one ethylenically unsaturated double bond, a photopolymerization initiator, and a high molecular weight binder, and (b) a protective layer comprising
 (1) a water-soluble vinyl polymer, and
 (2) a polymer which does not have a compatibility with polyvinyl alcohol and is water soluble in itself,
the protective layer being formed on the photopolymerizable layer.

According to the preferred embodiment of the present invention, there is provided the negative-working photosensitive material, wherein the polymer (b) (1) and the polymer (b) (2) constitute a sea-island structure.

According to further preferred embodiment of the present invention, there is provided the negative-working photosensitive material, wherein the polymer (b) (1) and the polymer (b) (2) constitute a two-layer structure.

DETAILED DESCRIPTION OF THE INVENTION

The present invention is described in detail below.

The water-soluble vinyl polymer (b) (1) contained in the protective layer in the present invention includes polyvinyl alcohol, the partial esters or ethers thereof, polyvinyl acetal, etc. Also, examples of other useful polymers are polyvinyl pyrrolidone, gelatin, gum arabic, etc. These polymers may be used alone or as mixtures of them. Further example of the polymer is a copolymer of the above-described polymers further containing an unsubstituted vinyl alcohol unit in an amount substantially necessary for imparting a water solubility.

A polyvinyl alcohol, 71 to 100% of which is hydrolyzed and which has a degree of polymerization of 300 to 2,400, is preferably used in the present invention. Examples of the polyvinyl alcohol specifically used are PVA-105, PVA-110, PVA-117, PVA-117A, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8, etc., all trade names, made by KURARAY CO., LTD.

The above copolymer includes polyvinyl chloroacetate or propionate, 88 to 100% of which is hydrolyzed, polyvinyl formal, polyvinyl acetal, and the copolymers of them.

In the photosensitive material of the present invention, the protective layer thereof contains the water-soluble vinyl polymer in a proportion of 30 to 99% by weight, and preferably from 50 to 99% by weight, based on the weight of the total solid contents of the protective layer.

The polymer (b) (2) which does not have a compatibility with polyvinyl alcohol and has a water solubility in itself, contained in the protective layer of the present invention is then explained.

The term "the polymer does not have a compatibility with polyvinyl alcohol" used herein means that after forming a coating film, the polymer and polyvinyl alcohol are separated into a sea-island state or two upper and lower phases.

Also, the term "water-soluble" used herein means that the polymer shows a sufficient solubility when the polymer is dissolved in water, and does not form white turbidity, precipitates, etc.

The above-described polymer which does not have a compatibility with polyvinyl alcohol and has a water solubility in itself (hereinafter this polymer is simply referred to as a "polymer (b) (2)") is preferably a polymer having a polyoxy-alkylene group, represented by following formula (I):

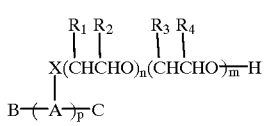

(I)

wherein A represents a hydrocarbon group having 1 to 30 carbon atoms, which may have a substituent (for example, a branched or cyclic alkylene group, an alkenylene group, an alkynylene group, an arylene group or combinations thereof); B and C each represent a hydrogen atom or a group of

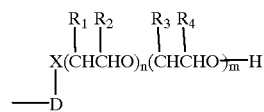

wherein D represents a hydrocarbon group having 1 to 30 carbon atoms, which may have a substituent (for example, a branched or cyclic alkyl group, an alkenyl group, an alkynyl group, and an aryl group; X represents a divalent linking group (for example, oxygen atom and sulfur atom); $R_1$, $R_2$, $R_3$ and $R_4$ each represent a hydrogen atom or an alkyl group, an alkenyl group, an alkynyl group or an aryl group, each having 1 to 30 carbon atoms; n and m each are a number of 0 to 500, provided that n and m are not simultaneously 0; and p is a number of 1 to 50. B and C may be the same or different, and $R_1$ and $R_2$ may be the same or different.

Of the polymers represented by the above formula (I), polymers represented by the following formulae 1 to 13 are preferably used.

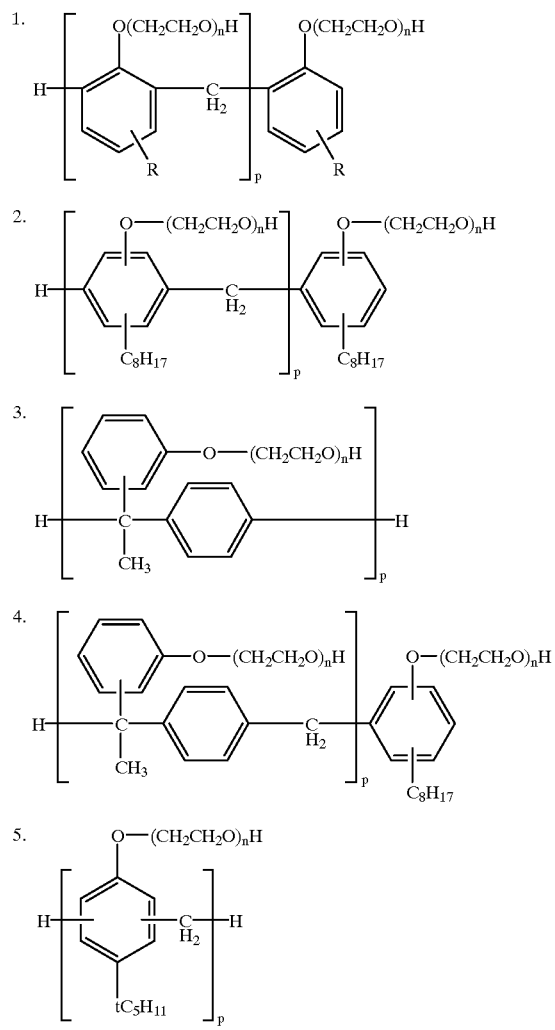

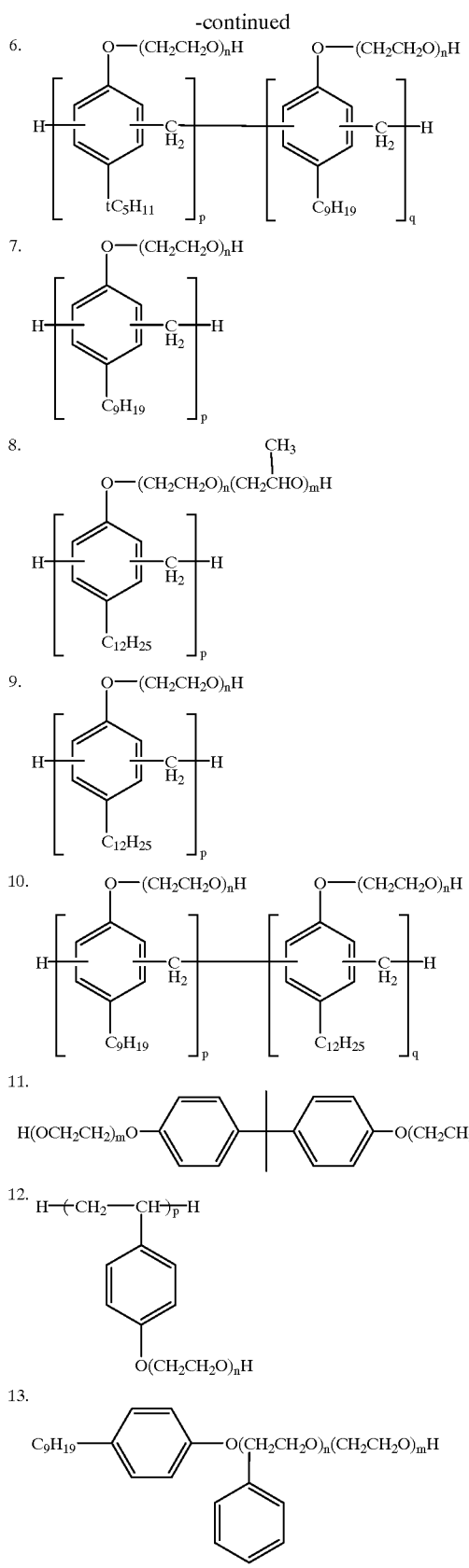

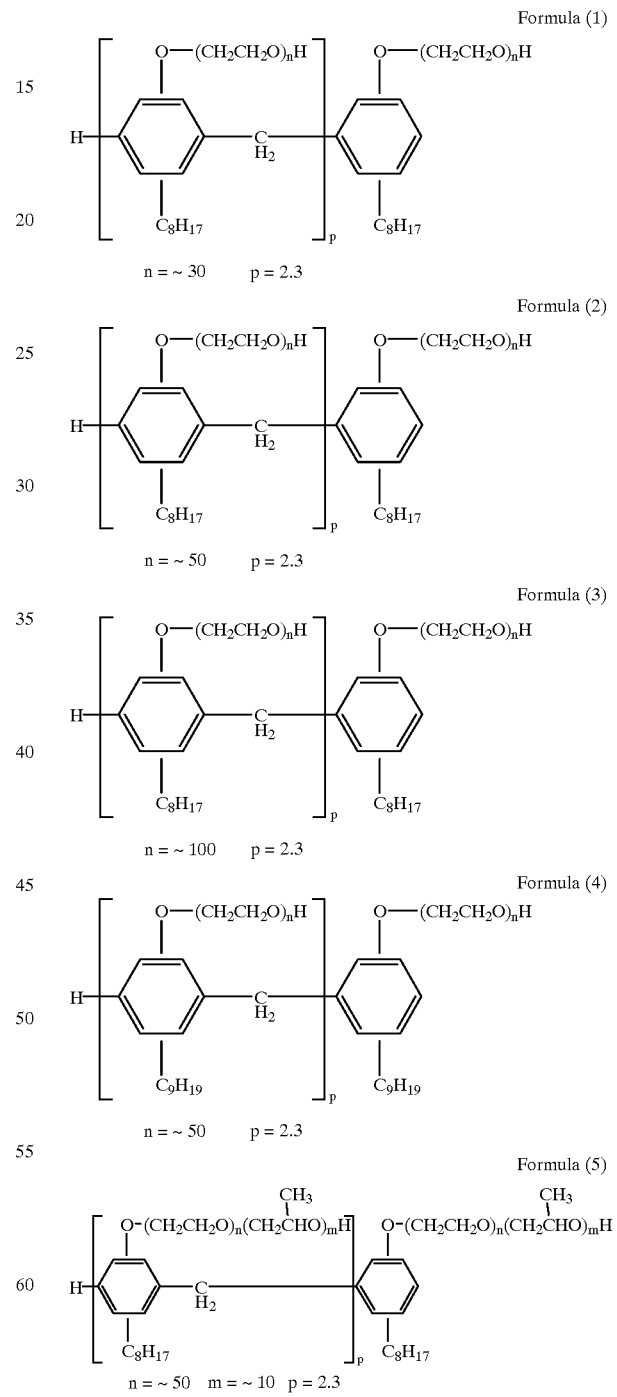

In the above formula 1, R represents a hydrocarbon group having 1 to 30 carbon atoms (for example, a branched or cyclic alkyl group, an alkenyl group, an alkynyl group, and an aryl group), and in the above formulae 1 to 13, n and m each are a number of 0 to 500; a, b, and c each are a number of 0 to 500; and p and q each are a number of 1 to 50.

Representative examples of the polymers represented by the above formulae are shown below.

Formula (6)
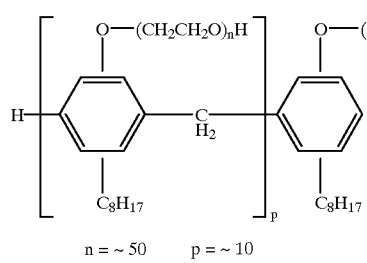

Formula (7)
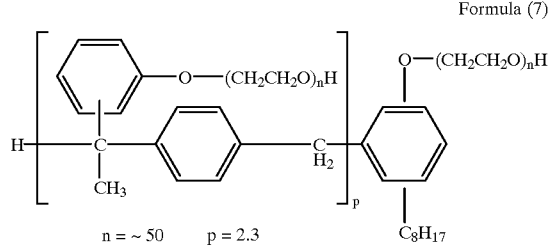

Formula (8)
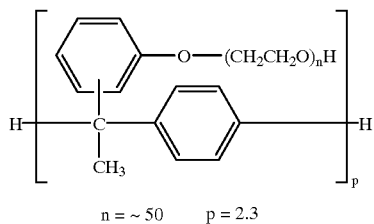

Formula (9)
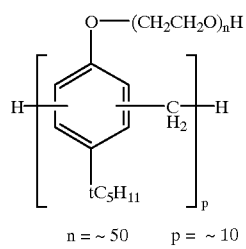

Formula (10)
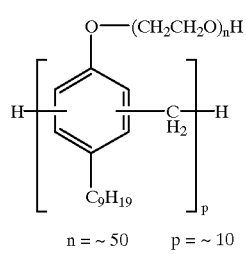

Formula (11)
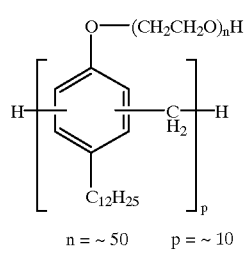

Formula (12)
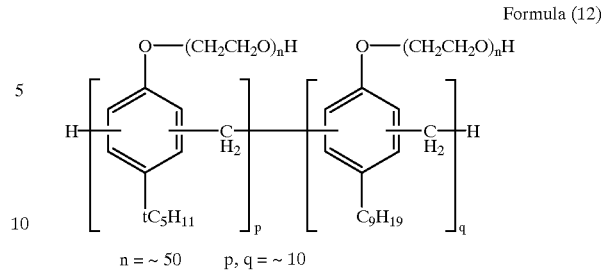

Formula (13)
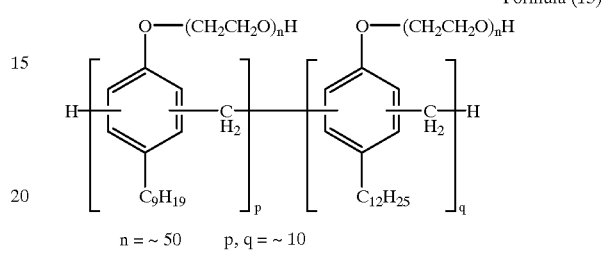

Formula (14)
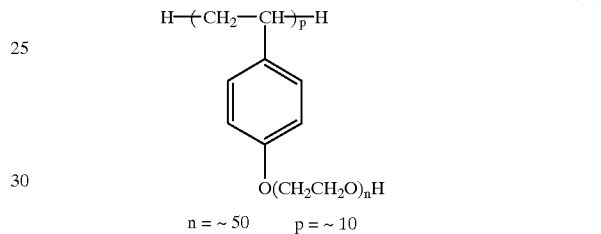

Formula (15)
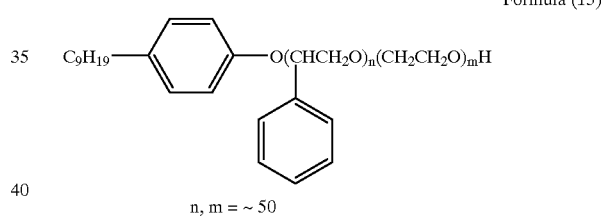

Of those polymers, the polymer represented by the formula (2) are preferably used. Those polymers having a relatively low molecular weight (Mw: 1,000 to 3,000) are commercially available, and the example thereof is, for example, PIONIN 600 series made by Takemoto Yushi K. K.

The polymers (b) (2) can be used alone or as a combination of two or more kinds.

The polymer (b) (2) has a weight average molecular weight of at least 1,000, and preferably 2,000 to 100,000, as polystyrene converted value measured by a gel permeation chromatography (GPC). When the weight average molecular weight of the polymer (b) (2) is fallen within the above-described range, the polymer loses the compatibility with polyvinyl alcohol and preferred results are obtained. However, if the weight average molecular weight of the polymer is too large, the viscosity of the solution thereof for forming the protective layer becomes high, which is undesirable on handling.

The polymer (b) (2) represented by the above formula (I) can also be obtained by the reaction of addition polymerizing an alkylene oxide to a polymer having a phenolic hydroxyl group represented by following formula:

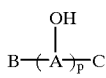

wherein B, A, C, and p are the same as defined in the formula (I) described above.

The alkylene oxide which is addition polymerized to the polymer having the phenolic hydroxyl group described above includes ethylene oxide, propylene oxide, butyrene oxide, styrene oxide, etc., which each may have a substituent. Ethylene oxide alone or a mixture of at least 30 mol % of ethylene oxide and propylene oxide, butyrene oxide or styrene oxide is preferred.

The above-described addition polymerization is usually conducted by block or random addition polymerizing an alkylene oxide such as ethylene oxide, etc., to the phenolic hydroxyl group of the polymer by reacting them using an alkali hydroxide such as sodium hydroxide, potassium hydroxide, etc., as a catalyst for 2 to 30 hours at a temperature of about 90 to 200° C.

The photosensitive material of the present invention contains in the protective layer thereof a polymer, which does not have a compatibility with polyvinyl alcohol of (b) (2) and is water-soluble in itself, in an amount of usually 1 to 50% by weight, and preferably 1 to 20% by weight, based on the weight of the total solid components. Adhesive force between the polymer layer and the protective layer is improved as the addition amount is increased, but there is a possibility that inking property and image quality deteriorate.

Dry coated amount of the protective layer is usually 0.5 to 10 g/m$^2$, and preferably 1.0 to 5.0 g/m$^2$.

In the present invention, the protective layer may be composed of plural layers by, for example, forming a layer (a first protective layer) containing the polymer of (b) (2) on the photopolymer layer and further forming a layer (a second protective layer) which does not contain the polymer of (b) (2). In this embodiment, the first protective layer functions as an adhesive layer.

The dry coated amount of the first protective layer is usually 0.1 to 10 g/m$^2$, and preferably 0.1 to 2.0 g/m$^2$.

There is no particular limitation on the coating method of the protective layer of the present invention regardless of a single layer or multilayer. The methods described in U.S. Pat. No. 3,458,311 or JP-A-55-49729 can be used.

Water is used as the solvent used in coating the protective layer.

The coating composition for the protective layer in the present invention may further contain conventional additives such as a surface active agent for improving the coating property, a water-soluble plasticizer for improving physical properties of the coated layer, etc. The water-soluble plasticizer used in this case includes propionamide, glycerol, sorbitol, etc. A water-soluble (meth)acrylic polymer, etc., may also be added.

The protective layer in the present invention has a good adhesive property to the photopolymerizing layer, is water soluble, and has an oxygen interceptive property. Further, the protective layer is transparent to an active light.

The photopolymerizable layer (a) in the present invention is explained below.

Main components of the photopolymerizable layer of the present invention are an addition polymerizable compound containing at least one ethylenically unsaturated double bond, a photopolymerization initiator and a polymeric binder. If required and necessary, the photopolymerizable layer can contain various compounds such as a heat polymerization inhibitor, a coloring material or a plasticizer.

The addition polymerizable compound containing an ethylenically unsaturated double bond can optionally be selected from the compounds each having at least one, and preferably at least two, terminal ethylenically unsaturated bonds. These compounds include, for example, compounds having the chemical forms such as monomers, prepolymers such as dimers and trimers, oligomers, or the mixtures thereof.

Examples of these compounds include esters of unsaturated carboxylic acids (for example, acrylic acid, methacrylic acid, itaconic acid, crotonic acid, isocrotonic acid, and maleic acid) and aliphatic polyhydric alcohols, amides of these unsaturated carboxylic acids and aliphatic polyvalent amines, etc.

Examples of monomers of the esters of aliphatic polyhydric alcohol compounds and unsaturated carboxylic acids are acrylic acid esters, methacrylic acid esters, itaconic acid esters, crotonic acid esters, isocrotonic acid esters and maleic acid esters.

Examples of the acrylic acid esters include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloyl-oxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomer.

Examples of the methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis-[p-(methacryloxy)-phenyl]dimethylmethane.

Examples of the itaconic acid esters include ethylene glycol itaconate, propylene glycol itaconate, 1,3-butanediol diitaconate, 1,4-butanediol diitaconate, tetramethylene glycol diitaconate, pentaerythritol diitaconate and sorbitol tetraitaconate.

Examples of the crotonic acid esters include ethylene glycol dicrotonate, tetramethylene glycol dicrotonate, pentaerythritol dicrotonate and sorbitol tetradicrotonate.

Examples of the isocrotonic acid esters include ethylene glycol diisocrotonate, pentaerythritol diisocrotonate and sorbiton tetradiisocrotonate.

Examples of the maleic acid esters include ethylene glycol dimaleate, triethylene glycol dimaleate, pentaerythritol dimaleate and sorbitol tetramaleate.

Mixtures of the above-described ester monomers can also be used.

Examples of monomers of the amides of the aliphatic polyvalent amine compounds and the unsaturated carboxylic acids include methylene bisacrylamide, methylene bismethacrylamide, 1.6-hexamethylene bisacrylamide, 1,6-hexamethylene bismethacrylate, diethylenetriamime trisacrylamide, xylylene bisacrylamide and xylylene bis-methacrylamide.

Other examples are vinylurethane compounds each having 2 or more polymerizable vinyl groups in one molecule obtained by adding a vinyl monomer having a hydroxyl group represented by the following formula (A) to a polyisocyanate compound having 2 or more isocyanate groups in one molecule described in JP-B-48-41708 (the term "JP-B" as used herein means an "examined and published Japanese patent application");

$$CH_2=C(R)COOCH_2CH(R')OH \qquad (A)$$

wherein R and R' each independently represent a hydrogen atom or a methyl group.

Further examples are polyfunctional acrylates and methacrylates such as urethane acrylates as described in JP-A-51-37193, polyester acrylates as described in JP-A-48-64183, JP-B-43191, and JP-B-52-30490, and epoxy acrylates obtained by reacting epoxy resins and (meth) acrylic acid. Furthermore, photo-curable monomers and oligomers described in "Nippon Setchaku Kyokai Shi (Journal of Adhesive Society of Japan), Vol. 20, No. 7, 300–308(1984) can be used.

The amount of these compounds used is 5 to 70% by weight (hereinafter referred to as "%" for simplicity), and preferably 10 to 50%.

As the photopolymerization initiator, various photoinitiators known in patents, literatures, etc., or combination systems (photoinitiator systems) of 2 or more kinds of photoinitiators can appropriately be selected and used depending on wavelength of a light source used.

For example, where an ultraviolet light of a wavelength of 400 nm or shorter is used as a light source, benzyl, benzoin, ether, Michler's ketone, anthraquinone, acridine, phenazine, benzophenone, etc., are widely used.

Further, where a visible light, an argon laser, or a YAG-SHG laser each having a wavelength of 400 nm or shorter is used as a light source, various photointiation systems are proposed. For example, there are certain kinds of photosensitive dyes described in U.S. Pat. No. 2,850,445, the composite initiation system of the dyes and the amines described in JP-B-44-20189, the system of using the hexaaryl bi-imidazole together with the radial generating agent, and the dye described in JP-B-45-37377, the system of the hexaaryl bi-imidazole and the p-dialkylaminobenzylidene ketone described in JP-B-47-2528 and JP-A-54-155292, the system of the cyclic cis-α-dicarboyl compound and the dye described in JP-A-48-84183, the system of the cyclic triazine and the merocyanine dye described in JP-A-54-151024, the systems of 3-ketocoumarins and the active agents described in JP-A-52-112681 and JP-A-58-15503, the system of the bi-imidazole, the styrene derivative, and the thiol described in JP-A-59-140203, the systems of the organic peroxides and the dyes described in JP-A-59-140203 and JP-A-59-189340, the system of the dye having a rhodanine skeleton and the radical generating agent described in JP-A-2-244050, the system of titanocene and the 3-ketocoumarin dye described in JP-A-63-221110, the systems of the combinations of titanocene, the xanthene dyes, and the addition polymerizable ethylenically unsaturated compounds containing an amino group or a urethane group (JP-A-4-221958 and JP-A-4-219756) and the system of titanocene and the specific merocyanine dye described in JP-A-6-295061.

The amount of the photopolymerization initiator used is 0.05 to 100 parts by weight, preferably 0.1 to 70 parts by weight, and more preferably 0.2 to 50 parts by weight, per 100 parts by weight of the ethylenically unsaturated compound.

The photosensitive material of the present invention usually contains a linear organic high molecular weight polymer as a binder. There is no particular limitation on the linear organic high molecular weight polymer so long as the polymer has a compatibility with the photopolymerizable ethylenically unsaturated compound. A water or weak alkaline water-soluble or swellable linear organic high molecular weight polymer developable with water or weak alkaline water is preferably selected.

The linear organic high molecular weight polymer is used not only as a film-forming agent of the photosensitive composition but also selectively used depending on the purpose of use as a water developer, a weak water developer, or an organic solvent developer. For example, if the water-soluble organic high molecular weight polymer is used, a water development becomes possible. As such a linear organic high molecular weight polymer, there are addition polymers each having a carboxylic acid group at the side chain, for example, addition polymers described in JP-A-59-44615, JP-B-54-34327, JP-B-58-12577, JP-B-54-25957, JP-A-54-92723, JP-A-59-53836, and JP-A-59-71048; that is, methacrylic acid copolymers, acrylic acid copolymers, itaconic acid copolymers, crotonic acid copolymers, maleic acid copolymers, partially esterified maleic acid copolymers, etc.

Acidic cellulose derivatives each having a carboxylic acid group at the side chain are also used in the present invention. Besides, a polymer obtained by adding a cyclic acid anhydride to an addition polymer having a hydroxyl group is also useful. In these polymers, a [benzyl (meth)acrylate/(meth) acrylic acid/if necessary, other addition polymerizable vinyl monomer] copolymer and an [allyl (meth)acrylate/(meth)-acrylic acid/if necessary, other addition polymerizable vinyl monomer] copolymer are particularly useful.

Other than the above, polyvinyl pyrrolidone, polyethylene oxide, etc., are useful as the water-soluble linear organic high molecular weight polymer. To increase the strength of the hardened film or layer, an alcohol-soluble polyamide and a polyether of 2,2-bis-(4-hydroxy-phenyl)propane and epichlorohydrin are useful.

These linear organic high molecular weight polymers each can be mixed with the photopolymerizing composition in an optional amount to the total solid components. However, when the mixing amount thereof exceeds 90% by weight, a preferred result is not obtained in the points of the image strength formed, etc. The preferred mixing amount thereof is 30 to 85%. The weight ratio of the photopolymerizable ethylenically unsaturated compound to the linear organic high molecular weight polymer is in the range of preferably from 1/9 to 7/3, and more preferably from 2/8 to 5/4.

It is desirable in the present invention to add, in addition to the basic components described above, a small amount of a thermal polymerization inhibitor in order to prevent occurrence of an unnecessary thermal polymerization of the polymerizable ethylenically unsaturated compound during the production or the storage of the photosensitive material. Appropriate thermal polymerization inhibitors are hydroquinone, t-butyl catechol, benzoquinone, 4,4'-thiobis (3-6-t-butyl-phenol), N-nitrosophenyl hydroxylamine cerous salt, etc. The amount of the thermal polymerization inhibitor added is preferably about 0.01 to 5% based on the weight of the total solid components.

If required and necessary, to prevent the polymerization hinderance with oxygen, a higher fatty acid derivative such as behenic acid, behenic acid amide, etc., may be added and be unevenly distributed at the surface portion of the photopolymerization layer during the drying step after coating.

The amount of the higher fatty acid derivative added is preferably about 0.5 to 10% based on the weight of the entire composition.

For the purpose of coloring the photopolymerizable layer, a coloring agent may be added to the photopolymerizing composition. The coloring agent used in the present invention includes, for example, pigments such as phthalocyanine pigments, azo pigments, carbon black, titanium oxide, etc.; and dyes such as Ethyl Violet, Crystal Violet, azo dyes, anthraquinone dyes, cyanine dyes, etc. The amount of the pigment or the dye added is preferably about 0.5% to 5% based on the weight of the total solid components.

To improve the properties of the hardened film or layer, additives such as inorganic fillers, plasticizers such as dioctyl phthalate, dimethyl phthalate, tricresyl phthalate, etc., may be added to the photopolymerizing composition. The amount of these additives added is preferably 10% or less based on the weight of the total solid components.

The photosensitive material of the present invention is usually coated on a support for use. In coating it on a support, various organic solvents can be used. The organic lot solvents used in the present invention include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol ethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, y-butyrolactone, methyl lactate, ethyl lactate, etc.

These solvents can be used alone or as a mixture of them. The concentration of the solid components in the coating liquid is preferably 2 to 50% by weight.

The coating composition for the photopolymerizable layer in the present invention may further contain a surface active agent to improve the surface property of the coated layer. The dry coated amount of the surface active agent is in the range of preferably from about 0.1 g/m$^2$ to 10 g/m$^2$, and more preferably from 0.5 to 5 g/m$^2$.

The support used is a plane material having a dimensional stability. The plane material having a dimensional stability includes papers; papers laminated with a plastic (for example, polyethylene, polypropylene, and polystyrene); plates of metals such as aluminum (including aluminum alloys), zinc, copper, etc.; films of plastics such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.; and papers or plastic films vapor-deposited or laminated with the metal described above. In these supports, the aluminum plate is particularly preferred because the plate is dimensionally stable and also inexpensive. A composite sheet obtained by laminating an aluminum sheet on a polyethylene terephthalate film as described in JP-B-48-18327 is also preferable.

In the case of a support having the surface of a metal, in particular, aluminum, it is preferred that the support is subjected to a surface treatment such as a graining treatment, an immersion treatment in an aqueous solution of sodium silicate, potassium fluorozirconate, a phosphate, etc., or an anodization treatment, etc.

An aluminum plate which has been subjected to a graining treatment and then to an immersion treatment in an aqueous sodium silicate solution is preferably used. An aluminum plate which has been subjected to an anodization treatment and then to an immersion treatment in an aqueous solution of an alkali metal silicate as described in JP-B-47-5125 is also suitably used.

The anodization treatment is conducted by passing an electric current in an electrolyte comprising an aqueous solution or a non-aqueous solution of an inorganic acid such as phosphoric acid, chromic acid, sulfuric acid, boric acid, etc., or an organic acid such as oxalic acid, sulfamic acid, etc., or the salt of the aforesaid acid, singly or as a combination of two or more kinds, using an aluminum plate as an anode.

A silicate electrodeposition as described in U.S. Pat. No. 3,658,662 is also effective. Further, the support having been subjected to the electrolytic graining treatment as described in JP-B-46-27481, JP-A-52-58602, and JP-A-52-30503 is also useful, and the above-described support having been further subjected to the above-described surface treatment by combining the anodization treatment and the aqueous sodium silicate solution treatment is also useful.

The support having been successively subjected to a mechanical roughening treatment, a chemical etching treatment, an electrolytic graining treatment, an anodization treatment, and an aqueous sodium silicate solution treatment as disclosed in JP-A-56-28893 is also suitable.

The support having been subjected to the above-described treatments and then undercoated with a water-soluble resin such as polyvinylsulfonic acid, a polymer or copolymer having a sulfonic acid group at the side chain, polyacrylic acid, etc.; a water-soluble metal salt (for example, zinc borate); a yellow dye, an amine salt, etc., is also suitable.

The substrate having been subjected to a sol-gel treatment to be covalent-bonded with a functional group capable of causing an addition reaction by a radical as described in JP-A-5-304358 is also suitably used.

These hydrophilic treatments are applied for rendering the surface of the support hydrophilic as well as for preventing the harmful reaction in the photopolymerizable layer formed thereon and for improving the adhesive property to the photopolymerizable layer.

The photosensitive material thus obtained can be used as a photosensitive lithographic printing plate.

The photosensitive lithographic printing plate can be subjected to a development treatment after being directly exposed by an Ar laser or a YAG-SHG laser. Further, after exposing through a transparent original by an active light using a light source such as a carbon arc lamp, a mercury lamp, a metal halide lamp, a xenon lamp, a tungsten lamp, etc., the photosensitive lithographic printing plate can be subjected to a development treatment.

Conventional aqueous alkali solutions can be used as a developer used for such a development treatment. The developing agent for the developer includes, for example, inorganic alkali agents such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, lithium hydroxide, etc. organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monosiopropanolamine, diisopropanolamine, ethyleneamine, ethylenediamine, pyridine, etc., can also be used.

These alkali agents can be used alone or as a combination of two or more kinds thereof.

In the above-described aqueous alkali solutions, the developer giving the very remarkable effect by the present invention is an aqueous solution containing an alkali metal silicate having a pH of at least 12.

In the aqueous solution of an alkali metal silicate, the developing property can be controlled by the ratio of silicon oxide $Si_2O$ and the alkali metal oxide $M_2O$ (generally shown by the molar ratio of $[SiO_2]/[M_2O]$) (wherein M represents an alkali metal atom), which are the components of the alkali metal silicate, and the concentration thereof. For example, the aqueous solution of sodium silicate, wherein the molar ratio of $SiO_2/Na_2O$ is 1.0 to 1.5 (that is, $[SiO_2]/[Na_2O]$ is 1.0 to 1.5) and the content of $SiO_2$ is 1 to 4% by weight, as disclosed in JP-A-54-62004 and the aqueous solution of the alkali metal silicate, wherein $[SiO_2]/[M]$ is 0.5 to 0.75 (that is, $[SiO_2]/[M_2O]$ is 1.0 to 1.5), the concentration of $SiO_2$ is 1 to 4% by weight, and the developer (the aqueous solution) contains at least 20% potassium based on the gram atoms of the total alkali metals existing in the developer, as described in JP-B-57-7427 are preferably used.

It is generally known that in the case of developing photosensitive lithographic printing plates using an automatic developing machine, a large amount of photosensitive lithographic printing plates can be developed for a long time without exchanging the developer in the development tank by adding an aqueous solution (replenishing liquid) having a higher alkalinity than the developer. Even in the case of using the photopolymerizing composition of the present invention, the replenishing system described above is preferably applied.

For example, the method of using an aqueous solution of sodium silicate wherein the molar ratio of $SiO_2/Na_2O$ of the developer is 1.0 to 1.5 (that is, $[SiO2]/[Na_2O]$ is 1.0 to 1.5) and the content of $SiO_2$ is 1 to 4% by weight and continuously or successively adding an aqueous sodium silicate solution (replenishing liquid), wherein the molar ratio of $SiO_2/Na_2O$ is 0.5 to 1.5 (that is, $[SiO_2]/[Na_2O]$ is 0.5 to 1.5), according to the treated amount of positive-working photosensitive lithographic printing plates as disclosed in JP-A-54-62004 and further the developing method of using a developer containing an alkali metal silicate, wherein $[SiO_2]/[M]$ is 0.5 to 0.75 (that is, $[SiO_2]/[M_2O]$ is 1.0 to 1.5) and the concentration of $SiO_2$ is 1 to 4% by weight, and using a replenishing liquid containing an alkali metal silicate, wherein $[SiO_2]/[M]$ is 0.5 to 0.75 (that is, $[SiO_2]/[M_2O]$ is 1.0 to 1.5), and in the developing method, each of the developer and the replenisher contains at least 20% potassium based on the gram atoms of the total alkali metals existing therein, as disclosed in JP-B-57-7427 are also suitably used.

The photosensitive lithographic printing plate thus developed is subjected to a post treatment with washing water, a rinsing liquid containing a surface active agent, etc., or a desensitizing liquid containing gum arabic, a starch derivative, etc., as described in JP-A-54-8002. JP-A-55-115045. JP-A-59-58431, etc. In the post treatment for the photosensitive lithographic printing plate of the present invention, these treatments can be used in the various combinations of them.

The lithographic printing plate obtained by such treatments is mounted on an offset printing machine and used for printing many prints.

In printing, a conventional plate cleaner for PS (presensitized) plate is used as a plate cleaner used for removing stains on the printing plate. Examples of the cleaner are CL-1, CL-2, CP, CN-4, CN, CG-1, PC-1, SR, IC (trade names, made by Fuji Photo Film Co., Ltd.), etc.

The present invention will be described in more detail by reference to the following examples, but it should be understood that the invention is not construed as being limited thereto.

EXAMPLE 1

After graining the surface of an aluminum plate of 0.30 mm in thickness using a nylon brush and an aqueous suspension of pumice of 400 mesh, the plate was washed well with water. After etching the aluminum plate by immersing the plate in an aqueous solution of 10% sodium hydroxide at 70° C. for 60 seconds, the aluminum plate was washed with running water, washed with an aqueous 20% nitric acid solution for neutralization, and then washed with water. The aluminum plate was then subjected to an electrolytic roughening treatment in an aqueous 1% nitric acid solution using an alternating wave form electric current of a sine wave under the condition of $V_A=12.7$ V at an anode electric quality of 160 coulombs/dm². The mean surface roughness of the aluminum plate measured was 0.6 µm (Ra indication).

Subsequently, after desmutting the aluminum plate by immersing it in an aqueous solution of 30% sulfuric acid at 55° C. for 2 minutes, the aluminum plate was subjected to an anodization treatment in an aqueous solution of 20% sulfuric acid at a current density of 2 A/dm² such that the thickness of the anodized film formed was 2.7 g/m².

On the aluminum plate thus treated was coated a photosensitive liquid having the following composition at a dry coverage of 1.4 g/m² and the coating was dried at 80° C. for 2 minutes to form a photopolymerizable layer.

[Photosensitive Liquid]

| | |
|---|---|
| Pentaerythritol tetraacrylate | 1.5 g |
| Allyl methacrylate/methacrylate (80/20 weight ratio) copolymer, molecular weight 30,000 (A) | 2.0 g |
| Compound 1 (sensitizing dye) shown below | 0.15 g |
| Compound 2 (photopolymerization initiator) shown below | 0.20 g |
| Compound 3 (photopolymerization initiator) shown below | 0.40 g |
| ε-Phthalocyanine/(A) dispersion | 0.20 g |
| Megafax F-177 (trade name of fluorine surface active agent, made by Dainippon Ink and Chemicals, Inc.) | 0.02 g |
| Kupelon AL (trade name of nitroso compound, made by Wako Pure Chemical Industries, Ltd.) | 0.015 g |
| Propylene glycol monomethyl ether | 7.5 g |
| Methyl ethyl ketone | 9.0 g |

-continued

Compound 1

$\lambda max = 514$ nm

Compound 2

Compound 3

On the photopolymerizable layer thus formed was coated a coating composition for a protective layer having the following composition at a dry coverage of 2.5 g/m² followed by drying at 100° C. for 3 minutes.
[Coated composition for protective layer]

| | |
|---|---|
| Polyvinyl alcohol (degree of saponification 98.5 mol %, degree of polymerization 500) | 22 g |
| Copolymer of Formula (2) | 1 g |
| Nonionic surface active agent (EMALEX NP-10, trade name, made by Nippon Emulsion K.K.) | 0.5 g |
| Distilled water | 450 g |

The above-described polymer of Formula (2) was a polymer having repeating units of —(CH$_2$CH$_2$O)— and —(CH$_2$CH$_2$(CH$_2$)O)—, obtained by the addition reaction of a phenolic hydroxyl group with ethylene glycol, ethylene oxide, and ethylene oxide having a methyl group as a substituent.

The photosensitivity test of the photopolymerizable layer formed was conducted by a visible light.

The visible light was that a xenon lamp was used as the light source, and the monochromatic light obtained through a Kenko optical filter BP-49 was used.

The measurement of the photosensitivity was conducted using a Fuji PS step guide (made by Fuji Photo Film Co., Ltd., a step tablet having a transmission optical density of the initial stage of 0.05, successively increasing 0.15 each until 15 stages). The photosensitivity was shown by the clear stage number of the PS step guide when the photosensitive layer was exposed for 24 seconds at the illuminance at the surface portion of the photosensitive layer of 0.0132 mW/cm².

The photosensitive material obtained was then heated to 100° C. for one minute and developed by immersing it in the developer having the following composition for 20 seconds at 25° C.

| | |
|---|---|
| 1K Potassium silicate | 30 g |
| Potassium hydroxide | 15 g |
| C$_{12}$H$_{25}$—C$_6$H$_4$—O—C$_6$H$_4$—SO$_3$Na | 3 g |
| Water | 1,000 g |

The measurement of the releasing force for evaluating the adhesive property between the photopolymerizable layer and an oxygen-interceptive protective layer was conducted using a Tensilon universal tension test machine (manufactured by K. K Toyo Boldwin). In the measurement, an adhesive tape (width 20 mm) was adhered to the protective layer of the unexposed photosensitive material, the protective layer was released together with the adhesive tape from the polymerizing layer by the Tensile universal tensile test machine at a speed of 40 mm/minute, the releasing force (g) required in this case was measured.

For the measurement of the printing ink-inking property, the photographic material was developed, and the surface of the photosensitive material was then treated with FP2W (a gum liquid, made by Fuji Photo Film Co., Ltd.) diluted twice. After allowing to stand for one day, the photosensitive material was mounted on a printing machine (Mitsubishi Dia 1F-2) for printing. The number of sheets from the start of printing until the printing ink was attached was confirmed.

EXAMPLES 2 TO 16

Photosensitive materials were prepared in the same manner as in Example 1 except that the polymer of the Formula (2) contained in the water-soluble protective layer was changed to each of the polymers shown in Table 1 below.

EXAMPLE 17

A photosensitive material was prepared in the same manner as in Example 1 except that the addition amount of the polymer of the Formula (2) contained in the water-soluble protective layer was changed to 3 g.

EXAMPLE 18

A photosensitive material was prepared in the same manner as in Example 1 except that the addition amount of the polymer contained in the water-soluble protective layer was changed to 3 g, and the degree of saponification and the degreee of polymerization of polyvinyl alcohol were changed to 88.0 mol % and 1,700, respectively.

Comparative Example 1

A photosensitive material was prepared in the same manner as in Example 1 except that the polymer of the Formula (2) was not added.

EXAMPLE 19

A photosensitive material was prepared in the same manner as in Example 1 except that 2 g of polyvinyl pyrrolidone (weight average molecular weight 40,000) was further added to the water-soluble protective layer.

EXAMPLE 20

A photosensitive material was prepared in the same manner as in Example 1 except that 4 g of diglycerol was further added to the water-soluble protective layer.

EXAMPLE 21

A photosensitive material was prepared in the same manner as in Example 1 except that 4 g of glycerol was further added to the water-soluble protective layer.

Comparative Example 2

A photosensitive material was prepared in the same manner as in Example 1 except that polyvinyl pyrrolidone (MW 40,000) was added in the form of the following composition in place of the polymer of the Formula (2).

| | |
|---|---|
| Polyvinyl alcohol (degree of saponification 98.5 mol %, degree of polymerization 500) | 11 g |
| Polyvinyl pyrrolidone | 2 g |
| Nonionic surface active agent (EMALEX NP-10, made by Nippon Emulsion K.K.) | 0.5 g |
| Distilled water | 450 g |

Comparative Example 3

A photosensitive material was prepared in the same manner as in Example 1 except that polyvinyl pyrrolidone (MW 40,000) was added in the form of the following composition in place of the polymer of the Formula (2).

| | |
|---|---|
| Polyvinyl alcohol (degree of saponification 98.5 mol %, degree of polymerization 500) | 8 g |
| Polyvinyl pyrrolidone | 1 g |
| Nonionic surface active agent (EMALEX NP-10, made by Nippon Emulsion K.K.) | 0.5 g |
| Distilled water | 450 g |

Comparative Example 4

A photosensitive material was prepared in the same manner as in Example 1 except that a composition obtained by adding a solution (solution b) containing a vinyl pyrrolidone/vinyl acetate (60/40) copolymer (MW 40,000) was added in the form of the following composition (solution a) in place of the polymer of the Formula (2).

| | |
|---|---|
| (Solution b) | |
| Vinyl pyrrolidone/vinyl acetate copolymer | 2 g |
| Distilled water | 8 g |
| Ethanol | 8 g |
| (Solution a) | |
| Polyvinyl alcohol (degree of saponification 98.5 mol %, degree of polymerization 500) | 8 g |
| Nonionic surface active agent (EMALEX NP-10, made by Nippon Emulsion K.K.) | 0.5 g |
| Distilled water | 450 g |

The results obtained in Examples 1 to 21 and Comparative Examples 1 to 4 are shown in Table 1 and Table 2 below.

TABLE 1

| | Compound | | Sensitivity | Release | |
|---|---|---|---|---|---|
| Example | Formula | Amount added (g) | Step of clear portion | force (g) | Inking property* |
| 1 | (2) | 1 | 9.0 | 70 | 10 |
| 2 | (1) | 1 | 9.0 | 110 | 10 |
| 3 | (3) | 1 | 9.0 | 120 | 12 |
| 4 | (4) | 1 | 9.0 | 70 | 10 |
| 5 | (5) | 1 | 9.0 | 85 | 13 |
| 6 | (6) | 1 | 9.0 | 85 | 10 |
| 7 | (7) | 1 | 9.0 | 70 | 10 |
| 8 | (8) | 1 | 9.0 | 60 | 13 |
| 9 | (9) | 1 | 9.0 | 60 | 13 |
| 10 | (10) | 1 | 9.0 | 60 | 12 |
| 11 | (11) | 1 | 9.0 | 70 | 10 |
| 12 | (12) | 1 | 9.0 | 140 | 15 |
| 13 | (13) | 1 | 9.0 | 130 | 15 |
| 14 | (14) | 1 | 9.0 | 55 | 10 |
| 15 | (15) | 1 | 9.0 | 50 | 10 |
| 16 | (16) | 1 | 9.0 | 60 | 10 |

Note
*:Number of ink receptivity

TABLE 2

| | Degree of saponification (%) | Compound of Formula (2) | | Additive (2) | |
|---|---|---|---|---|---|
| | | Degree of polymerization | Amount added (g) | Kind | Amount added (g) |
| Example | | | | | |
| 17 | 98.5 | 500 | 3 | None | 0 |
| 18 | 88.0 | 1,700 | 3 | None | 0 |
| 19 | 98.5 | 500 | 1 | Polyvinyl pyrrolidone | 2 |
| 20 | 98.5 | 500 | 1 | Diglycerin | 4 |
| 21 | 98.5 | 500 | 1 | Glycerin | 4 |
| 22 | 98.5 | 500 | (Laminating as adhesive layer; dry coverage: 0.5 g/m$^2$) | | |
| Comparative Example | | | | | |
| 1 | 98.5 | 500 | 0 | None | 0 |
| 2 | 98.5 | 500 | 0 | Polyvinyl pyrrolidone | 2 |
| 3 | 98.5 | 500 | o | Polyvinyl pyrrolidone | 14 |
| 4 | 98.5 | 500 | o | Vinyl pyrrolidone/vinyl acetate | 2 |

| | Sensitivity Step of clear portion | Release force (g) | Inking property* |
|---|---|---|---|
| Example | | | |
| 17 | 9.0 | 90 | 10 |
| 18 | 8.5 | 80 | 13 |
| 19 | 8.5 | 85 | 15 |
| 20 | 8.5 | 90 | 10 |
| 21 | 8.5 | 90 | 10 |
| 22 | 9.0 | 140 | 13 |
| Comparative Example | | | |
| 1 | 9.0 | 18 | 10 |
| 2 | 8.5 | 22 | 12 |
| 3 | 6.5 | 75 | 150 |
| 4 | 6.5 | 40 | 15 |

Note
*:Number of ink receptivity

It can be seen from the results shown in Tables 1 and 2 above that addition of the polymer which does not have a compatibility with polyvinyl alcohol and is water soluble in itself can improve the adhesive force without deterioration of the sensitivity and the inking property. In addition, the trouble of images (poor film hardening) due to separation of the protective layer which occurred in the sample of comparative Example 1 does not occur in the samples of Examples 1 to 18.

The above results also show that addition of polyvinyl pyrrolidone can improve the adhesive force. In this case, however, the sensitivity and the inking property deteriorate, which is not practical (Comparative Example 3). On the other hand, addition of the polymer as used in the present invention can improve the adhesive force without deterioration of the sensitivity and the inking property (Example 19). It can also seen that where the polymer as used in the present invention is used, the properties do not deteriorate even by the addition of polyvinyl pyrrolidone or other compound (Examples 20 and 21).

Further, where the polymer as used in the present invention, which does not have a compatibility with polyvinyl alcohol and is water-soluble in itself, is not used and a vinyl pyrrolidone/vinyl acetate copolymer is used, the sensitivity deteriorates and also the adhesive force is insufficient for practical use (Comparative Example 4).

EXAMPLE 22

The 2% aqueous solution as used in Example 1 was coated on the polymerizing layer as a first protective layer at a dry coverage of 0.5 g/m$^2$, and dried at 100° C. for 3 minutes. A coating liquid having the following composition was further coated thereon as a second protective layer at a dry coverage of 2.5 g/m$^2$, and dried at 100° C. for 3 minutes.

| | |
|---|---|
| Polyvinyl alcohol (degree of saponification 98.5 mol %, degree of polymerization 500) | 22 g |
| Nonionic surface active agent (EXALEX NP-10, made by Nippon Emulsion K.K.) | 0.5 g |
| Distilled water | 450 g |

The releasing force of the multilayer protective layer was 140 g, the sensitivity was substantially the same as that in Example 1, and the inking property was 13 sheets.

The results obtained are shown in Tables 1 and 2 above.

As described in detail above, the negative-working photosensitive material of the present invention shows a high sensitivity to an Ar$^+$ laser and a YAG-SHG laser and has excellent adhesive property between the protective layer and the photopolymerizing layer by using the specific protective layer without deterioration of the development processability and the inking property.

While the invention has been described in detail and with reference to specific examples thereof, it will be apparent to one skilled in the art that various changes and modifications can be made therein without departing from the spirit and scope thereof.

What is claimed is:

1. A negative-working photosensitive material comprising a support, and having formed thereon
   (a) a photopolymerizable layer comprising an addition polymerizable compound having at least one ethylenically unsaturated double bond, a photopolymerization initiator, and a high molecular weight binder, and
   (b) a protective layer comprising
      (1) a water-soluble vinyl polymer, and
      (2) a polymer which does not have a compatibility with polyvinyl alcohol and is water soluble in itself,
   the protective layer being formed on the photopolymerizable layer.

2. The negative-working photosensitive material as claimed in claim 1, wherein said polymers (b)(1) and (b)(2) constitutes a sea-island structure.

3. The negative-working photosensitive material as claimed in claim 1, wherein said polymers (b)(1) and (b)(2) constitute a two-layer structure.

* * * * *